(12) United States Patent
Harper et al.

(10) Patent No.: US 12,500,081 B2
(45) Date of Patent: *Dec. 16, 2025

(54) METHOD OF DEPOSITION

(71) Applicant: SPTS Technologies Limited, Newport (GB)

(72) Inventors: Tristan Harper, Newport (GB); Kathrine Crook, Newport (GB)

(73) Assignee: SPTS Technologies Limited, Newport (GB)

( * ) Notice: Subject to any disclaimer, the term of this patent is extended or adjusted under 35 U.S.C. 154(b) by 526 days.

This patent is subject to a terminal disclaimer.

(21) Appl. No.: 17/891,089

(22) Filed: Aug. 18, 2022

(65) Prior Publication Data

US 2023/0079067 A1 Mar. 16, 2023

(30) Foreign Application Priority Data

Aug. 31, 2021 (GB) ...................................... 2112421

(51) Int. Cl.
| | |
|---|---|
| *H01L 21/02* | (2006.01) |
| *C23C 16/36* | (2006.01) |
| *C23C 16/50* | (2006.01) |
| *H01J 37/32* | (2006.01) |
| *H01L 23/00* | (2006.01) |

(52) U.S. Cl.
CPC ........ *H01L 21/02167* (2013.01); *C23C 16/36* (2013.01); *C23C 16/50* (2013.01); *H01J 37/3244* (2013.01); *H01J 37/32522* (2013.01); *H01L 21/02274* (2013.01); *H01J 37/32091* (2013.01); *H01J 37/32816* (2013.01); *H01J 2237/3321* (2013.01)

(58) Field of Classification Search
None
See application file for complete search history.

(56) References Cited

U.S. PATENT DOCUMENTS

| | | | |
|---|---|---|---|
| 9,691,733 B1 | 6/2017 | Shen et al. | |
| 2004/0241463 A1* | 12/2004 | Vincent | C23C 16/401 |
| | | | 65/17.2 |
| 2012/0222741 A1 | 9/2012 | Davies et al. | |
| 2012/0235171 A1 | 9/2012 | Kim et al. | |

FOREIGN PATENT DOCUMENTS

| | | |
|---|---|---|
| CN | 101510576 A | 8/2009 |
| TW | 201514332 A | 4/2015 |

OTHER PUBLICATIONS

IPO, Search Report for GB2112421.9, May 31, 2022.
TIPO, Office Action issued for ROC (Taiwan) Patent Application No. 111131162, Sep. 3, 2025 (see X/A designations on p. 6).

* cited by examiner

*Primary Examiner* — Asok K Sarkar
(74) *Attorney, Agent, or Firm* — Hodgson Russ LLP

(57) ABSTRACT

According to the present invention there is provided a method of depositing a hydrogenated silicon carbon nitride (SiCN:H) film onto a substrate by plasma enhanced chemical vapour deposition (PECVD) comprising the steps of: providing the substrate in a chamber; introducing silane ($SiH_4$), a hydrocarbon gas or vapour, nitrogen gas ($N_2$), and hydrogen gas ($H_2$) into the chamber; and sustaining a plasma in the chamber so as to deposit SiCN:H onto the substrate by PECVD at a process temperature of less than about 200° C.

19 Claims, 3 Drawing Sheets

METHOD OF DEPOSITION

Two-dimensional (2D) scaling of electronic devices based on Moore's law is set to continue for the foreseeable future. However, three-dimensional (3D) integration of devices, either homogeneous or heterogeneous, offers great potential for advanced system development. It is believed that "stacking" devices in 3D could achieve greater integration, which in turn will provide improved device performance, improved functionality and, in time, reduced cost compared to a 2D scaling approach. To achieve efficient 3D integration of devices, it is desirable to bond two substrates, such as device wafers, together so that a large number of dies can be stacked simultaneously. Surface activated bonding techniques are promising candidates for achieving suitable 3D stacking of devices. Typically, a surface activated bonding process includes treating a surface of two substrates for example with a dielectric bonding/adhesion layer, such as a silicon carbon nitride (SiCN) layer (including a hydrogenated silicon carbon nitride (SiCN:H) layer). The two treated surfaces may then be smoothed by chemical mechanical planarization (CMP), precisely aligned, pressed together at an elevated temperature, and annealed so as to bond the substrates together.

Known surface activated bonding techniques use dielectric bonding layers and adhesion layers, such as SiCN and SiCN:H, which are deposited at a high temperature (about 340-370° C.) and may further require densification steps at about 420° C. prior to bonding. Typically, an organosilane pre-cursor such as trimethyl (3MS) or tetramethyl silane (4MS) as the source of Si and C while ammonia is commonly used as the source of N. Process pressures are in the range 1-5 Torr. Due to the high temperatures required, these known processes are not suitable for bonding substrates which have a low thermal budget constraint (i.e., temperature sensitive substrates). For example, it is critical that substrates comprising device layers and/or interconnects, which may include copper layers embedded in a dielectric, maintain a low thermal budget to avoid damaging the devices.

However, simply lowering the deposition temperature of the bonding and adhesion layers results in adhesion layers having poor bond strength, poor copper barrier layer properties, and high sensitivity to moisture. Nagano et al (ECS J. Solid State Sci. Technol. 9 123011) show FTIR spectra for PECVD SiCN films using $NH_3/SiH_x(CH_3)_y$ precursors deposited at process temperatures of 370 and 200° C. The FTIR spectra are shown in FIG. 2. For the films deposited at 200° C., both as deposited films and the films following three months exposure to air show that the Si—O peak at 1025 cm−1 increases relative to the Si—C (830 cm−1) and Si—N(940 cm−1) peaks, while the Si—$CH_3$ (1260 cm−1) peak slightly decreases. As no oxidant is present in the deposition process the low temperature film is adsorbing oxygen from the atmosphere. In contrast, the 370° C. film does not change. The reduction in the Si—$CH_3$ peak suggests that the Si—$CH_3$ is not stable even at room temperature while Elastic Recoil Detection (ERD) measurements indicate that the 200° C. film contains ~12.7 at % O. As a consequence of the presence of O in the film, the bond quality of the film is degraded. The stable 370° C. film produces a bond strength of 2.3 $Jm^{-2}$, while the 200° C. film produces a bond strength of 1.4 $Jm^{-2}$. It can be seen that simply lowering the temperature of known deposition processes provides unacceptable results.

There is therefore a need for a method in which dielectric barrier and adhesion layers for wafer-wafer bonding can be deposited at significantly lower temperatures, whilst maintaining excellent device performance. This is desirable so that a wider variety of substrates (in particular substrates having low thermal budget constraints) can be bonded using surface activated bonding techniques. By providing such a method, improved 3D integration of devices can be achieved, which is expected to improve device performance. There is also a need for a low temperature SiCN:H deposition process to produce SiCN:H films which do not contain or absorb significant amounts of 0 (<1 at %) and are stoichiometrically stable as determined by change in FTIR spectra over time. The SiCN:H film should also be compatible with the other requirements of wafer-wafer bonding such as surface roughness and cost.

The present invention, in at least some of its embodiments, addresses the above-described problems and needs.

According to a first aspect of the invention there is provided a method of depositing a hydrogenated silicon carbon nitride (SiCN:H) film onto a substrate by plasma enhanced chemical vapour deposition (PECVD) comprising the steps of:

providing the substrate in a chamber;

introducing silane ($SiH_4$), a hydrocarbon gas or vapour, nitrogen gas ($N_2$), and hydrogen gas ($H_2$) into the chamber; and sustaining a plasma in the chamber so as to deposit SiCN:H onto the substrate by PECVD at a process temperature of less than about 200° C.

Using a deposition recipe comprising the combination of a hydrocarbon gas or vapour, nitrogen gas ($N_2$), and hydrogen gas ($H_2$) as reactive precursors has been found to produce a stable SiCN:H film with good barrier layer and adhesion layer properties, whilst maintaining within low thermal budget constraints. The SiCN:H film is suitable for use as an adhesion layer in surface activated bonding processes. Therefore, the method is suitable for 3D integration of a wide variety of substrates, including device wafers, which contain temperature sensitive device layers and their interconnects that may be embedded in the substrate. The reactive precursors used can consist essentially of the combination of a hydrocarbon gas or vapour, nitrogen gas ($N_2$), and hydrogen gas ($H_2$). Preferably, the reactive precursors used consist of the combination of a hydrocarbon gas or vapour, nitrogen gas ($N_2$), and hydrogen gas ($H_2$). Optionally, one or more non-reactive carrier gases, such as helium or argon, may also be introduced into the chamber.

The hydrocarbon gas or vapour can be an alkyne, alkane or an alkene, optionally an unbranched alkyne, an unbranched alkane or an unbranched alkene.

The hydrocarbon gas or vapour is a $C_2$-$C_6$ alkyne, which may be branched or unbranched. The $C_2$-$C_6$ alkyne can be acetylene ($C_2H_2$). Using a deposition recipe comprising the combination of silane ($SiH_4$), acetylene, nitrogen gas ($N_2$), and hydrogen gas ($H_2$) has been found to produce SiCN:H films with particularly desirable characteristics, for example, as a good copper barrier layer.

Alternatively, the hydrocarbon gas or vapour can be a $C_1$-$C_6$ alkane, which may be branched or unbranched. The $C_1$-$C_6$ alkane can be methane ($CH_4$), propane ($C_3H_8$), butane ($C_4H_{10}$), pentane ($C_5H_{12}$) or hexane $C_6H_{14}$).

The silane ($SiH_4$), hydrocarbon gas or vapour, nitrogen gas ($N_2$), and hydrogen gas ($H_2$) can be each introduced into the chamber at an associated flow rate in sccm. The flow rates can be in the following order, from highest to lowest: nitrogen gas ($N_2$), hydrogen gas ($H_2$), silane($SiH_4$), hydrocarbon gas or vapour.

Silane (SiH$_4$) is a silicon-donating precursor. Silane (SiH$_4$) can be introduced into the chamber at a flow rate in the range of 10-800 sccm, optionally, 20-500 sccm, optionally 100-300 sccm, or optionally about 200 sccm.

The hydrocarbon gas or vapour can be introduced into the chamber at a flow rate in the range of 10-500 sccm, optionally 20-300 sccm, optionally 100-200 sccm, or optionally about 150 sccm.

Nitrogen gas (N$_2$) is a nitrogen-donating precursor. Nitrogen gas (N$_2$) can be introduced into the chamber at a flow rate in the range of 500-5,000 sccm, optionally 1,000-3,000 sccm, optionally 1,000-2,000 sccm, or optionally about 1,500 sccm. Optionally, ammonia (NH$_3$) is absent as a nitrogen-donating precursor. Advantageously, N$_2$ is the only nitrogen-donating precursor used.

Hydrogen gas (H$_2$) can be introduced into the chamber at a flow rate in the range of 50-1,000 sccm, optionally 100-800 sccm, optionally 200-700 sccm, optionally 300-700 sccm, or optionally about 550 sccm. Surprisingly, it has been found that the use of H$_2$ as a precursor reduces H content in the film, which in turn produces a more dense and stable film.

During the PECVD step, the process temperature can be less than 190° C., or optionally about 175° C. The process temperature can be more than 100° C., optionally more than 125° C., optionally more than 150° C. Maintaining the substrate at these temperatures can keep the substrate within low thermal budget constraints, which makes the present method suitable for depositing SiCN:H films onto temperature sensitive substrates. For example, the method can be used to deposit SiCN:H (adhesion) layers onto temperature sensitive substrates comprising device layers and/or interconnects, which may include copper layers embedded in a dielectric.

Whilst the plasma is being sustained in the chamber, the chamber can have a pressure in the range of 1-5 Torr, optionally 1-3 Torr, optionally 1.4-2.0 Torr, or optionally about 1.75 Torr.

The steps of the first aspect of the invention can be performed in a capacitively coupled PECVD reactor.

The plasma can be sustained using a high frequency RF power. Alternatively, the plasma can be sustained using a high frequency RF power and a low frequency RF power.

The high frequency RF power can have a frequency in the range of 10-15 MHz, preferably 13.56 MHz. The high frequency RF power can have a power in the range of 300-2,000 W, optionally 800-1,200 W, or optionally about 1,000 W.

The low frequency RF power can have a frequency in the range of 100-500 kHz, optionally about 200-450 kHz, optionally, about 300-400 kHz, or optionally about 380 kHz. The low frequency RF power can have a power in the range of 0-200 W, optionally 0-50 W, or optionally about 0 W.

The hydrogenated silicon carbon nitride (SiCN:H) film can be an amorphous film (e.g., a-SiCN:H).

The substrate can be a semiconductor substrate.

According to a second aspect of the invention there is provided a substrate with a SiCN:H film deposited thereon using the method according to the first aspect.

The substrate can be a semiconductor substrate. The substrate can be a silicon substrate or silicon wafer. The substrate can comprise a plurality of die. The substrate can comprise features, such as one or more device layers and/or interconnects. The features may be temperature sensitive. The features can comprise copper layers, for example, copper layers embedded in a dielectric material.

According to a third aspect of the invention there is provided a method of bonding two substrates comprising the steps of:

providing a first substrate with a SiCN:H film according to the second aspect;

providing a second substrate with a SiCN:H film according to the second aspect; and bringing the SiCN:H film of the first substrate into contact with the SiCN:H film of the second substrate at a temperature of less than about 250° C. so as to bond the SiCN:H film of the first substrate with the SiCN:H film of the second substrate.

The SiCN:H film of the first substrate can be brought into contact with the SiCN:H film of the second substrate at a temperature in the range of 100-250° C., optionally 125-225° C., optionally 150-200° C., or optionally about 175° C.

The method of bonding the two substrates can further comprise a smoothing step, such as a chemical mechanical planarization (CMP) step, to smooth the SiCN:H film of the first and/or second substrates. The method of bonding two substrates can further comprise the step of aligning the first and second substrate prior to the bringing the SiCN:H films of the first and second substrates into contact.

According to a fourth aspect of the invention there is provided a device comprising a stack of two or more substrates produced using the method of the third aspect.

Whist the invention has been described above, it extends to any inventive combination of the features set out above, or in the following description, drawings or claims. For example, any features disclosed in relation to one aspect of the invention may be combined with any features disclosed in relation to any of the other aspects of the invention.

Embodiments of the invention will now be described, by way of example only, with reference to the accompanying drawings, in which.

Figure 1:
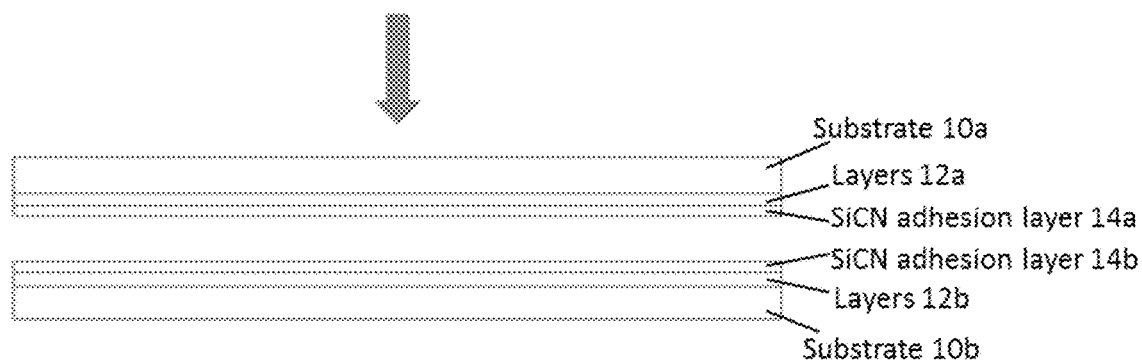
FIG. 1 is a schematic side view of two substrates ready to undergo a surface activated substrate-substrate bonding process.
Figure 2:
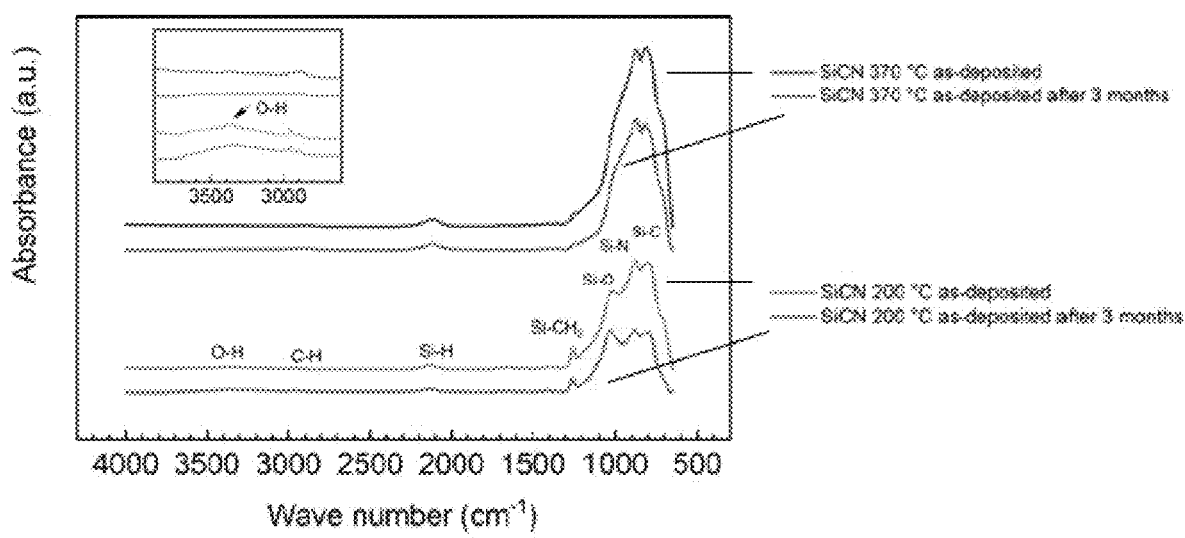
FIG. 2 shows prior art FTIR spectra for PECVD SiCN films from Nagano et al, using NH$_3$/SiH$_x$(CH$_3$)$_y$ precursors deposited at process temperatures of 370 and 200° C.

FIG. 1 shows a schematic of a surface activated bonding process used to bond two substrates together. The substrates 10a, 10b may comprise temperature sensitive features, such as device layers 12a, 12b. An adhesion layer 14a, 14b, such as a silicon carbon nitride (SiCN) layer, such as a hydrogenated silicon carbon nitride (SiCN:H) layer, is deposited on a surface of each substrate 10a, 10b. The two adhesion layers 14a, 14b can be smoothed, for example by chemical mechanical planarization (CMP), precisely aligned, pressed together at an elevated temperature, and annealed so as to bond the two substrates together via the adhesion layers 14a, 14b.

Apparatus suitable for depositing silicon carbon nitride (SiCN) films, such as SiCN:H films, according to exemplary methods of the present invention (and comparative examples) include an SPTS Delta™ parallel plate PECVD apparatus, which is commercially available from SPTS Technologies Limited, located in Newport, South Wales, UK. All exemplary embodiments and comparative examples described below were performed using this apparatus.

EXEMPLARY EMBODIMENTS

The present invention provides a method of depositing hydrogenated silicon carbon nitride (SiCN:H) films that are acceptable for use as adhesion layers in a surface activated bonding process. In particular, acceptable SiCN:H films can be deposited onto substrates at temperatures of less than about 200° C., optionally less than 190° C., or optionally about 175° C. The substrate can be a semiconductor substrate, such as a silicon substrate or silicon wafer. The substrate can comprise a plurality of die. The substrate can comprise temperature sensitive features, such as device layers and interconnects, which may include copper layers embedded in a dielectric.

Exemplary embodiments of the invention comprise introducing silane ($SiH_4$), a hydrocarbon gas or vapour, nitrogen gas ($N_2$), and hydrogen gas ($H_2$) into a PECVD chamber. Optionally, one or more non-reactive carrier gases may also be introduced into the chamber. A plasma is sustained within the chamber so that a PECVD process can occur, which causes SiCN:H to deposit onto the substrate. The hydrocarbon gas or vapour can be an alkyne, alkane or an alkene.

To control the H content in the film and to promote the growth of Si—N bonds, the conventional approach of using ammonia as the main nitrogen-donating precursor was replaced by using $N_2$ as the source of N in the film. A reduction in the $CH_x$ incorporation in the film was achieved by using silane with a hydrocarbon carbon-donating precursor such as $C_2H_2$. By using $C_2H_2$ as a dopant as opposed to an organosilane as is standard practice in the art, it was possible to achieve fine tuning of the film properties at low temperatures. Surprisingly it was found that the post deposition stability of the film was improved by the addition of $H_2$.

Table 1 shows exemplary PECVD process parameters suitable for achieving stable SiCN:H films at a deposition temperature in a range of 100-250° C. These parameters are for 300 mm diameter wafers, and HF power levels would be expected to be reduced for wafers having a diameter of 200 mm or less in order to maintain similar power densities. As a general trend the optimal gas flows were found to be in the order $N_2$>$H_2$>$SiH_4$>hydrocarbon.

TABLE 1

Representative process parameters.

| Process Parameters | Unit | Range | Preferred Range |
|---|---|---|---|
| Chamber pressure | mTorr | 1000-5000 | 1400-2000 |
| $N_2$ flow rate | Sccm | 500-5000 | 1000-3000 |
| Hydrocarbon gas or vapour flow rate | Sccm | 10-500 | 20-300 |
| $SiH_4$ flow rate | Sccm | 10-800 | 20-500 |
| $H_2$ | Sccm | 50-1000 | 100-750 |

TABLE 1-continued

Representative process parameters.

| Process Parameters | Unit | Range | Preferred Range |
|---|---|---|---|
| HF RF power | W | 300-2000 | 800-1200 |
| LF RF power | W | 0-200 | 0-50 |
| Temperature | ° C. | 100-200 | 150-200 |

In exemplary embodiments, SiCN:H films were deposited onto a 300 mm silicon wafer at 175° C. by PECVD. The reactive precursors were silane ($SiH_4$), acetylene, nitrogen gas ($N_2$), and hydrogen gas ($H_2$).

The chamber pressure was in the range of 1.75 Torr. The plasma was sustained using RF power at 13.56 Hz and 1000 W. The flow rates of the reactive precursors were 200 sccm silane, 150 sccm acetylene, 1450 sccm nitrogen, and 550 sccm hydrogen.

Figure 3:
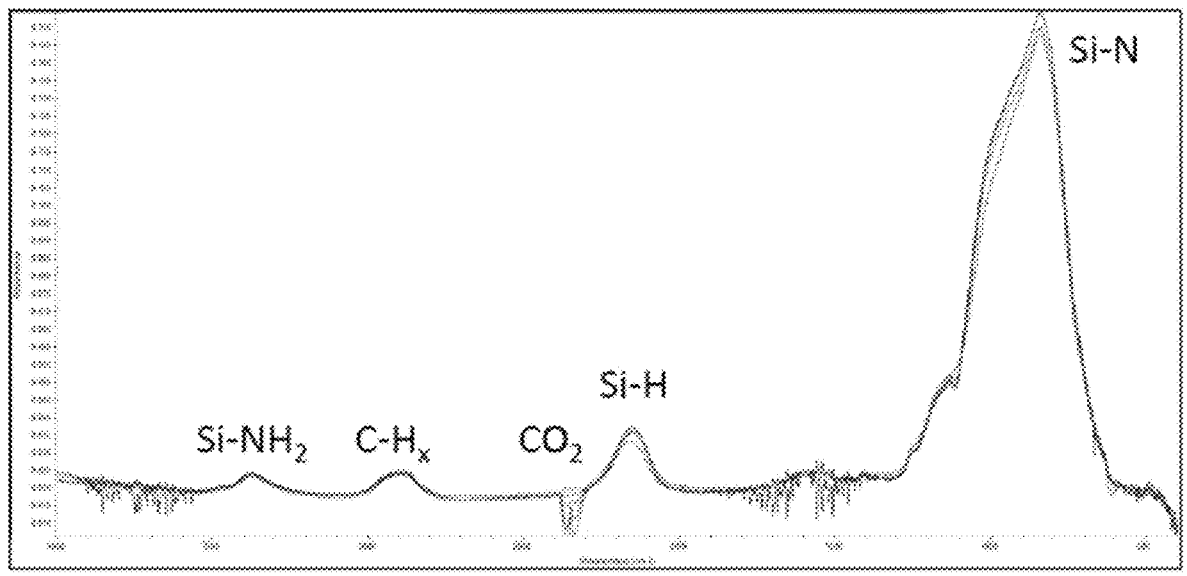
FIG. 3 shows FTIR spectra of a SiCN:H film deposited using a method of the present invention, the spectra obtained on the film as deposited and after seven days exposed to atmosphere.

In FIG. 3 we can see a seven consecutive daily FTIR spectra, absorbance (a.u.) vs wavenumber $cm^{-1}$, for a SiCN:H film (LDR A) deposited using $SiH/N_2/C_2H_2/H_2$ as the source gases. Note the absence of a distinct Si—$CH_3$ peak and no clear Si—O peak at 1260 cm-1 and 1025 cm-1 respectively indicating that the levels of methyl groups incorporated into the film are low and that oxygen is absent. Also present are Si—H at 2100 cm-1, C—H at ~2900 cm-1 and Si—$NH_2$ at ~3380 cm-1. Over a seven day period at atmosphere and at room temperature the spectra so not show any significant changes suggesting that the films are stable. We attribute the ~3380 cm-1 peak to be Si—$NH_2$ as opposed to O—H as ERD measurements indicate that there is <1 at % O in the films and the FTIR spectra does not change with time.

Figure 4:
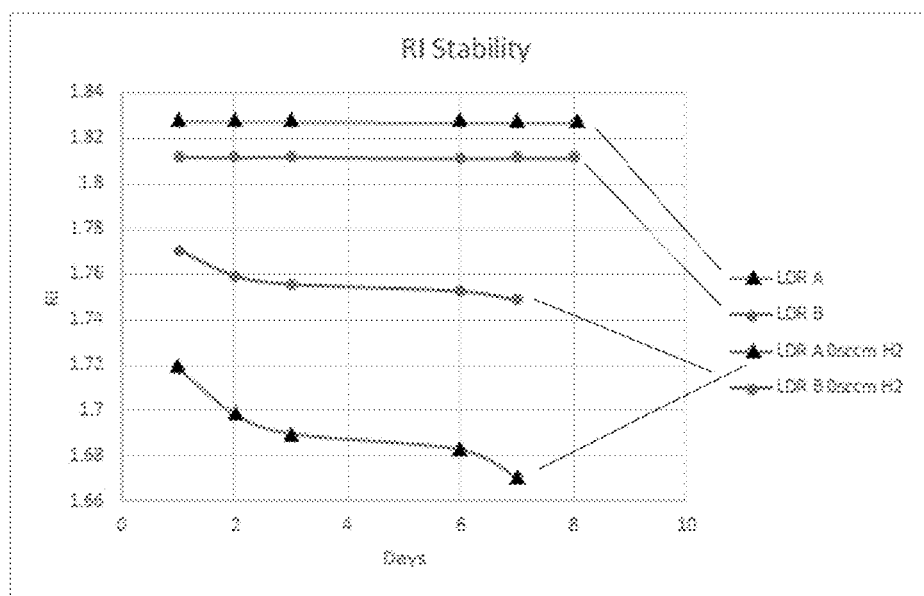
FIG. 4 shows refractive index (RI) for two types of SiCN:H films deposited using methods of the present invention at 175° C. with/without H$_2$ when exposed to air over a seven day period.
Figure 5:
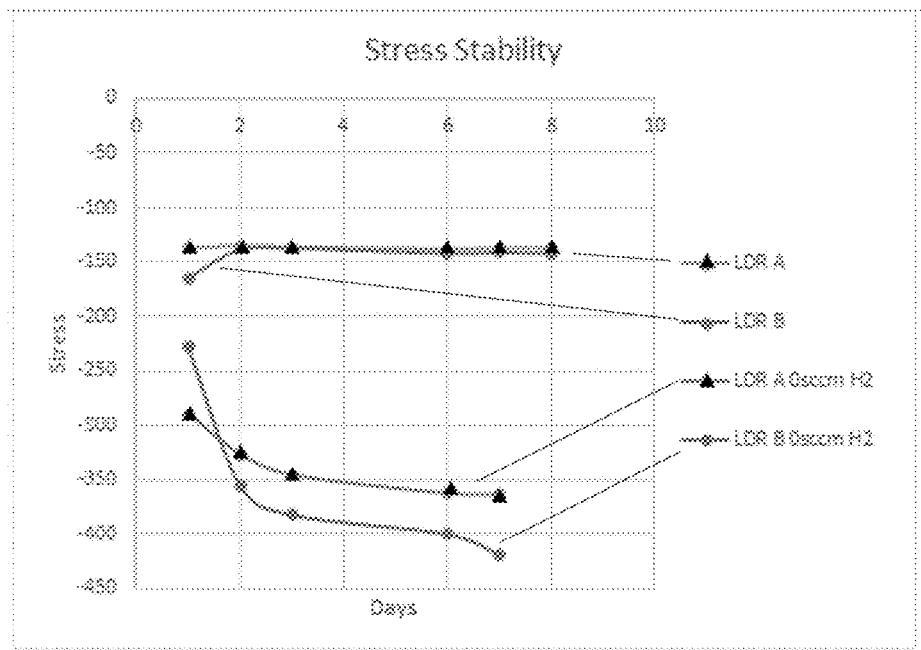
FIG. 5 shows stress for the two types of SiCN:H films deposited using methods of the present invention at 175° C. with/without H$_2$ when exposed to air over a seven day period.

FIGS. 4 and 5 respectively show the RI (refractive index) and stress stability of two types of SiCN:H films with and in the absence of $H_2$. The process parameters for these two films used conditions from Table 1 with the exception of the $H_2$ content for the films where no $H_2$ was present in the depositions. We can see that $H_2$ significantly improves the stability of the film. FTIR spectra for these films can be seen in FIG. 6.

Figure 6:
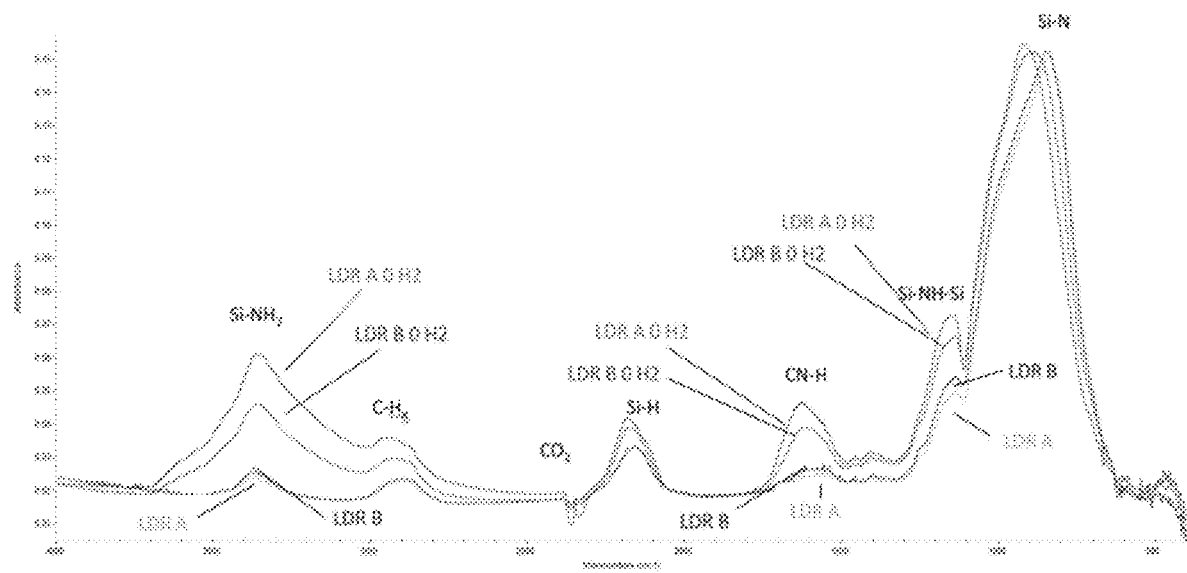
FIG. 6 shows FTIR spectra for the two types of SiCN:H films deposited using methods of the present invention at 175° C. with/without H$_2$.

Unexpectedly, the addition of $H_2$ to the plasma results in a reduction in the H content in the as deposited film as indicated in FIG. 6. Table 2 indicates that the H content of the film associated with Si—H bonding, determined from the ratio of the area of the Si—H and SiN peaks, is reduced to approximately half of the value when $H_2$ dilution was not used. This is consistent with the RI values in FIG. 4 where the SiCN:H films deposited without $H_2$ as a precursor are lower than those deposited in with $H_2$. The lower RI values of the as-deposited film are indicative of a lower density film which would be expected when the H content of the film is increased. We speculate that the use of $H_2$ in the deposition step creates a more energetic plasma which reduces the amount of H to Si bonds formed. We speculate further that this also increases the in-situ densification of the film.

TABLE 2

FTIR SiH:SiN peak area ratio for films in FIGS. 4-6.

| Film | SiH:SiN |
|---|---|
| LDR A | 0.0487 |
| LDR A no $H_2$ | 0.112 |
| LDR B | 0.0549 |
| LDR B no $H_2$ | 0.101 |

We can see that the FTIR spectra for the two films that use $H_2$ as a precursor have very similar spectra. However, films deposited without $H_2$ present show an increase of absorbance of all major peaks coupled with a movement of the Si—N peak to higher wave numbers. The presence of a stable peak at ~3380 cm−1 which is attributed to Si—$NH_2$ seems to be a characteristic of this novel type of low temperature SiCN:H films.

The surface roughness of the as deposited films with $H_2$ as measured by Atomic Force Microscopy was 1.67 & 1.89 nm for the two films LDR A & LDR B. Deposition rates of 90-520 nm/min can be achieved for stable films over a wide range of deposition parameters.

By varying the $C_2H_2$ flow for a fixed $N_2/H_2/SiH_4$ flow it was possible to tune the C content of the film. In this way, a stoichiometric composition could be achieved at 175° C. which was similar to that achieved by the high temperature process at 370° C. using $NH_3/SiH_x(CH_3)_y$ precursors as determined from ERD, EDAX and FTIR.

The use of acetylene as a source of carbon reduces $CH_3$ incorporation into the film. This is advantageous, since the presence of $CH_3$ is believed to result in an unstable film. Acetylene is also a relatively low cost source of carbon. It is cheaper than an organosilane and offers more control over carbon content. However, other hydrocarbon precursors might be used instead as a source of carbon, for example methane, propane, butane, pentane and hexane.

The invention claimed is:

1. A method of depositing a hydrogenated silicon carbon nitride (SiCN:H) film onto a substrate by plasma enhanced chemical vapour deposition (PECVD) comprising the steps of:
   providing the substrate in a chamber;
   introducing silane ($SiH_4$), a hydrocarbon gas or vapour, nitrogen gas ($N_2$), and hydrogen gas ($H_2$) into the chamber, wherein the silane ($SiH_4$), the hydrocarbon gas or vapour, the nitrogen gas ($N_2$), and the hydrogen gas ($H_2$) are each introduced into the chamber at an associated flow rate in sccm, and the flow rates are in the following order, from highest to lowest: the nitrogen gas ($N_2$), the hydrogen gas ($H_2$), the silane ($SiH_4$), and the hydrocarbon gas or vapour; and
   sustaining a plasma in the chamber so as to deposit SiCN:H onto the substrate by PECVD at a process temperature of less than about 200° C.

2. The method according to claim 1, wherein the hydrocarbon gas or vapour is an alkyne, alkane or an alkene.

3. The method according to claim 2, wherein the hydrocarbon gas or vapour is a $C_2$-$C_6$ alkyne.

4. The method according to claim 3, wherein the $C_2$-$C_6$ alkyne is acetylene ($C_2H_2$).

5. The method according to claim 2, wherein the hydrocarbon gas or vapour is a $C_1$-$C_6$ alkane.

6. The method according to claim 5, wherein the hydrocarbon gas or vapour is methane ($CH_4$), propane ($C_3H_8$), butane ($C_4H_{10}$), pentane ($C_5H_{12}$) or hexane ($C_6H_{14}$).

7. The method according to claim 2, wherein the hydrocarbon gas or vapour is an unbranched alkyne, an unbranched alkane or an unbranched alkene.

8. The method according to claim 1, wherein the silane ($SiH_4$) is introduced into the chamber at the flow rate in the range of 10-800 sccm.

9. The method according to claim 1, wherein the hydrocarbon gas or vapour is introduced into the chamber at the flow rate in the range of 10-500 sccm.

10. The method according to claim 1, wherein the nitrogen gas ($N_2$) is introduced into the chamber at the flow rate in the range of 500-5,000 sccm.

11. The method according to claim 1, wherein the hydrogen gas ($H_2$) is introduced into the chamber at the flow rate in the range of 50-1,000 sccm.

12. The method according to claim 1, wherein the process temperature is less than 190° C.

13. The method according to claim 1, wherein whilst the plasma is being sustained in the chamber, the chamber has a pressure in the range of 1-5 Torr.

14. The method according to claim 1, wherein the steps are performed in a capacitively coupled PECVD reactor.

15. The method according to claim 1, wherein the hydrogenated silicon carbon nitride film is an amorphous hydrogenated silicon carbon nitride film (a SiCN:H).

16. The method according to claim 1, wherein the substrate is a semiconductor substrate.

17. A substrate with a SiCN:H film deposited thereon using the method according to claim 1.

18. The method according to claim 1, further comprising:
   providing two or more of the substrate with the SiCN:H film, wherein the two or more of the substrate includes a first substrate with the SiCN:H film and a second substrate with the SiCN:H film; and
   bonding the SiCN:H film of the first substrate to the SiCN:H film of the second substrate at a temperature of less than about 250° C.

19. A device comprising a stack of two or more substrates produced using the method according to claim 17.

* * * * *